(12) United States Patent
Lien

(10) Patent No.: US 6,194,296 B1
(45) Date of Patent: Feb. 27, 2001

(54) METHOD FOR MAKING PLANARIZED POLYCIDE

(75) Inventor: Chuen-Der Lien, Los Altos Hills, CA (US)

(73) Assignee: Integrated Device Technology, Inc., Santa Clara, CA (US)

( * ) Notice: Subject to any disclaimer, the term of this patent is extended or adjusted under 35 U.S.C. 154(b) by 714 days.

(21) Appl. No.: 08/558,564

(22) Filed: Oct. 31, 1995

(51) Int. Cl.$^7$ .............................................. H01L 21/3205
(52) U.S. Cl. ..................... 438/592; 438/626; 438/655; 438/657
(58) Field of Search .................. 437/41 GS, 41 SM, 437/193, 200; 257/413; 438/592, 626, 655, 657

(56) References Cited

U.S. PATENT DOCUMENTS

| | | | |
|---|---|---|---|
| 4,900,690 | * | 2/1990 | Tamura ................................. 437/43 |
| 4,935,376 | * | 6/1990 | Hillenius et al. ...................... 437/41 |
| 5,332,692 | * | 7/1994 | Saitoh .................................. 437/193 |
| 5,350,698 | * | 9/1994 | Huang et al. .......................... 437/26 |
| 5,441,904 | * | 8/1995 | Kim et al. ............................. 437/40 |

OTHER PUBLICATIONS

Wolf, S., et al., Silicon Processing, vol. 1, 1986, Lattice Press, pp. 175–182.*
Wolf, S., Silicon Processing, vol. 2, 1990, Lattice Press, pp. 222–239.*

* cited by examiner

Primary Examiner—T. N. Quach
(74) Attorney, Agent, or Firm—Bever Hoffman & Harms, LLP

(57) ABSTRACT

Planarized polycide structures and methods for making the same. One embodiment includes a semiconductor structure having an irregular upper surface caused, for example, by the presence of field oxide surrounding an active region of an FET. A layer of polysilicon is located over the irregular upper surface of the semiconductor structure. The polysilicon layer has a substantially flat upper surface. A metal silicide layer is located over the flat upper surface of the polysilicon layer to form a polycide structure. This planarized polycide structure can be used, for example, as a gate electrode in an FET. In another embodiment, the planarized polycide structure includes a first polysilicon layer located over a semiconductor substrate. The polysilicon layer has an irregular upper surface. A dielectric layer is located over a portion of the upper surface of the polysilicon layer, such that the upper surface of the dielectric layer and the portion of the upper surface of the polysilicon layer which does not underlie the dielectric layer are substantially co-planar. A metal silicide layer is located over the co-planar upper surfaces of the polysilicon layer and the dielectric layer. The present invention also includes methods for fabricating planarized polycide structures.

10 Claims, 6 Drawing Sheets

METHOD FOR MAKING PLANARIZED POLYCIDE

FIELD OF THE INVENTION

This invention relates to a semiconductor structure which includes polycide. The invention has broad applicability to the fabrication of various semiconductor structures.

BACKGROUND OF THE INVENTION

Polycide refers to a structure which includes a layer of doped polycrystalline silicon (polysilicon) and an overlying metal silicide layer. Polycide is used, for example, to form gate electrodes in field effect transistors (FETs). FIG. 1 is a top view of an n-channel FET 100 which includes source region 101, drain region 102, polycide gate electrode 103, and field oxide 107. FIG. 2a is a cross sectional view of FET 100 along plane 2a—2a of FIG. 1. FIG. 2b is a cross sectional view of FET 100 along plane 2b—2b of FIG. 1. FIGS. 2a and 2b also show gate oxide 106 and silicon semiconductor substrate 110.

Polycide gate electrode 103 is typically fabricated by depositing a layer of polysilicon 103a over field oxide 107 and gate oxide 106, conductively doping polysilicon layer 103a, depositing a layer of metal silicide 103b over polysilicon layer 103a, and performing one or more masking and etching steps. Polycide gate electrode 103 can also be formed by depositing and conductively doping polysilicon layer 103a, depositing a metal layer over polysilicon layer 103a, and performing a heating step in which part, but not all, of polysilicon layer 103a is consumed to form a metal silicide layer over the remaining polysilicon layer.

Polysilicon layer 103a provides an appropriate work function to gate electrode 103 and an appropriate threshold voltage to FET 100 according to the work function and the voltage threshold parameters desired. Silicide layer 103b provides a low contact resistance with polysilicon layer 103a (compared, for example, to an aluminum gate electrode) and reduces the overall sheet resistance of gate electrode 103.

There are several drawbacks associated with polycide gate electrode 103. As illustrated in FIG. 2b, silicide layer 103b typically has bad step coverage. In the areas where underlying polysilicon layer 103a undergoes a change in height, i.e., at portions 111 and 112, silicide layer 103b is deposited to a lesser thickness than the remainder of silicide layer 103b. Portions 111 and 112 have a high resistance compared to the rest of silicide layer 103b, thereby undesirably increasing the resistance of gate electrode 103.

Another problem with FET 100 is that topography changes at the surface of the FET structure can cause depth of focus difficulties when performing conventional lithography steps. This loss of resolution requires the use of a wider line size.

A further problem with polycide gate 103 is that silicide layer 103b exerts stress on polysilicon layer 103a. If this stress becomes large enough, damage to the underlying gate oxide 106 may occur.

Another problem is specific to polycides fabricated by tungsten chemical vapor deposition (CVD). A tungsten fluoride gas ($WF_6$) in a silane ($SiH_4$) carrier is typically used during the CVD fabrication of tungsten silicide ($WSi_x$, where $x \geq 2$). Some of the fluorine in the tungsten fluoride gas may be present in the tungsten silicide after the tungsten silicide is deposited. This fluorine can diffuse through the underlying polysilicon layer 103a to gate oxide 106 during subsequent thermal cycling, thereby degrading the dielectric properties of gate oxide 106.

Another problem can occur when etching unwanted portions of a polycide structure. For example, if polycide gate 103 of FIG. 2b is anisotropically etched, undesired spacers, referred to as silicide stringers, may be formed adjacent to step portions 111 and 112 because the vertical thickness of silicide layer 103b is too thick to be completely removed at these locations. FIG. 3 illustrates silicide stringers 121–122. Silicide stringers 121–122 can undesirably create leakage paths between gate electrodes. To eliminate silicide stringers 121–122, the silicide etch is sometimes prolonged. However, because the selectivity of the silicide etchant to polysilicon is typically less than 1:1, the silicide etchant will attack the underlying polysilicon layer 103a faster than silicide layer 103b. Thus, any attempt to prolong the silicide etch to remove silicide stringers 121–122 may result in the removal of an excessive amount of polysilicon layer 103a. If the prolonged silicide etch extends through polysilicon layer 103a, the gate oxide layer 106 may be attacked. The selectivity of the silicide etchant to silicon oxide is typically in the vicinity of 5:1 to 1:1. The silicide etchant can therefore potentially reach and undesirably destroy portions of gate oxide 106.

It would therefore be desirable to have a structure and method of forming a polycide gate which eliminates or mitigates the above-described shortcomings of prior art polycide structures.

SUMMARY

Accordingly, the present invention provides a planarized polycide structure and a method for making the same. One embodiment includes a semiconductor structure having an irregular upper surface. This irregular upper surface can be caused, for example, by the presence of field oxide surrounding an active region of an FET. A layer of polycrystalline silicon (polysilicon), is located over the irregular upper surface of the semiconductor structure. The polysilicon layer has a substantially flat upper surface. A metal silicide layer having a substantially uniform thickness is located over the flat upper surface of the polysilicon layer, thereby forming a planarized polycide structure. This planarized polycide structure can be used, for example, as a gate electrode in an FET. Because the metal silicide layer is located over the flat upper surface of the polysilicon layer, the problems associated with prior art polycide structures are mitigated.

More specifically, the prior art problems caused by irregularities in the upper surface of the polysilicon layer, namely, poor silicide step coverage, loss of resolution during photolithography and formation of silicide stringers, are eliminated because the metal silicide layer is located over the flat upper surface of the polysilicon layer.

To provide a polysilicon layer having a flat upper surface, the thickness of the polysilicon layer is made larger than the thickness of a conventional polysilicon layer 103a (FIGS. 2a–2b). The thicker polysilicon layer advantageously dissipates the stress introduced by the metal silicide layer. In addition, the thicker polysilicon layer makes it less likely that impurities such as fluorine will seep through the polysilicon layer to an underlying gate oxide.

In an alternative embodiment, the planarized polycide structure includes a first polysilicon layer located a semiconductor substrate. The polysilicon layer has an irregular upper surface. A dielectric layer is located over a portion of the upper surface of the polysilicon layer, such that the upper surface of the dielectric layer and the portion of the upper surface of the polysilicon layer which does not underlie the dielectric layer are substantially co-planar. A metal silicide layer is located over the co-planar upper surfaces of the polysilicon layer and the dielectric layer. In one embodiment, a portion of the metal silicide layer contacts a portion of the polysilicon layer. In another embodiment, a second polysilicon layer is located over the co-planar upper surfaces of the polysilicon layer and the dielectric layer, and the metal silicide layer is located over the second polysilicon layer.

The present invention also includes methods for forming polycide over a semiconductor structure having an irregular upper surface. One such method includes the steps of:

(1) forming a first layer of non-monocrystalline silicon over the irregular upper surface of the semiconductor structure, (2) planarizing the upper surface of the first non-monocrystalline silicon layer, and (3) forming a metal silicide layer over the planarized upper surface of the first non-monocrystalline silicon layer. One variation of this method includes the additional steps of (4) forming a second non-monocrystalline silicon layer over the planarized upper surface of the first non-monocrystalline silicon layer, and (5) forming the metal silicide layer over the second non-monocrystalline silicon layer.

Another method in accordance with the invention includes the steps of:

(1) forming a first non-monocrystalline silicon layer over the irregular upper surface of the semiconductor structure, (2) forming a dielectric layer over the first non-monocrystalline silicon layer, (3) planarizing the upper surface of the dielectric layer such that the upper surface of the dielectric layer is substantially co-planar with a portion of the upper surface of the first non-monocrystalline silicon layer, and (4) forming a layer of metal silicide over the dielectric layer and the first non-monocrystalline silicon layer. A variation of this method includes the additional steps of (5) forming a second non-monocrystalline silicon layer over the dielectric layer and the first non-monocrystalline silicon layer, and (6) forming the metal silicide layer over the second non-monocrystalline silicon layer.

In the above-described methods, the planarizing steps can include the steps of (1) providing a planarization layer over the first non-monocrystalline silicon layer or the dielectric layer such that the planarization layer has a substantially planar upper surface and (2) etching back the planarization layer and upwardly protruding parts of the first non-monocrystalline silicon layer or the dielectric layer. The etchant is selected to attach the planarization layer and the underlying first non-monocrystalline silicon layer or dielectric layer at approximately the same rate. In particular embodiments, the planarization layer is spin-on-glass or photoresist.

In the above-described methods, the planarizing steps can also include chemical-mechanical polishing and/or selective etching.

DETAILED DESCRIPTION OF THE INVENTION

Figure 4:
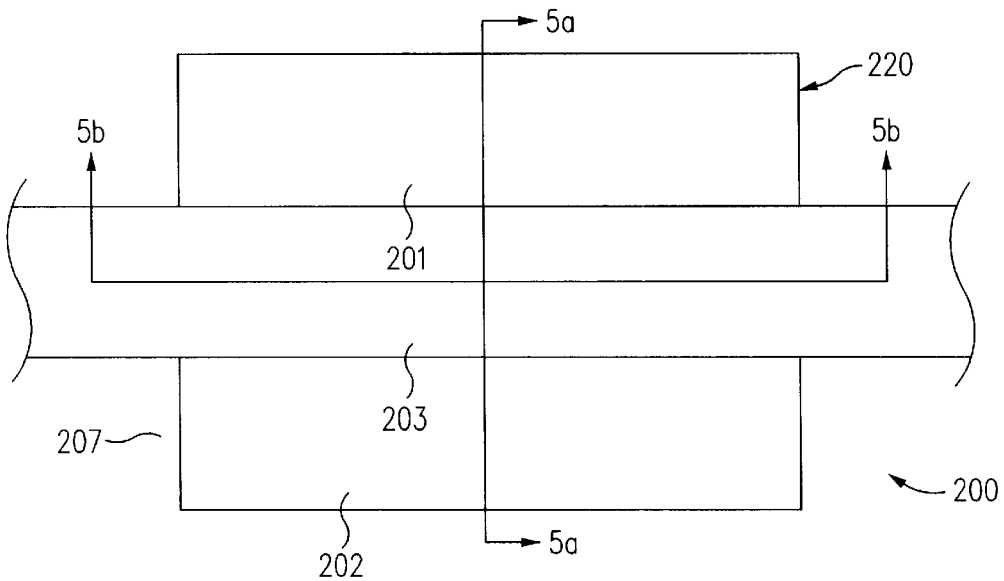
FIG. 4 is a top view of an FET having a planarized polycide gate electrode in accordance with one embodiment of the invention.
Figure 5A:
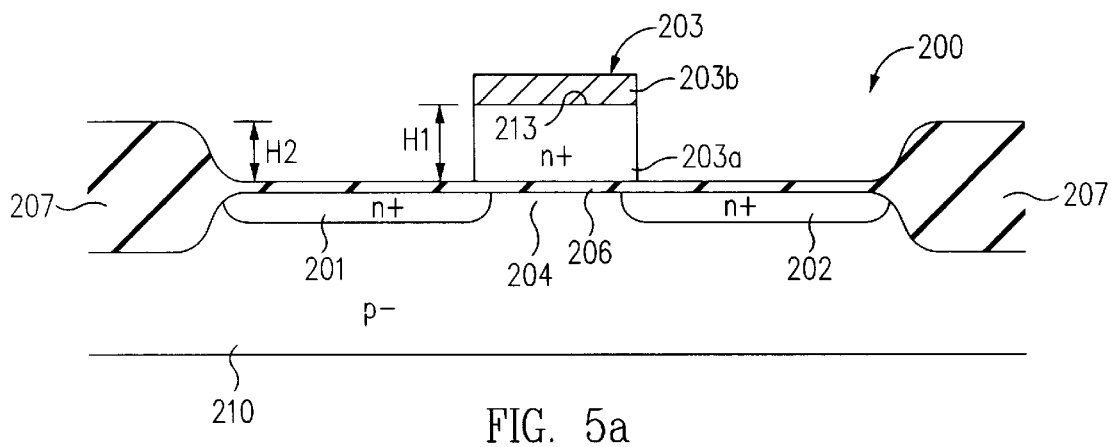
FIG. 5a is a cross sectional view of the FET of FIG. 4 along plane 5a—5a of FIG. 4.
Figure 5B:
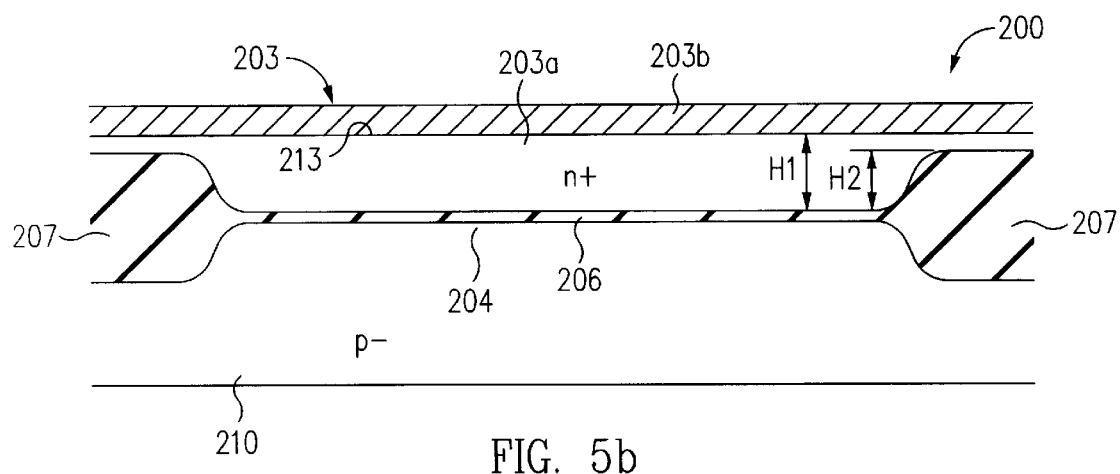
FIG. 5b is a cross sectional view of the FET of FIG. 4 along plane 5b—5b of FIG. 4.

FIG. 4 is a top view of an n-channel FET 200 which has a planarized polycide gate electrode 203 in accordance with one embodiment of the invention. FIG. 5a is a cross sectional view of FET 200 along plane 5a—5a of FIG. 4. FIG. 5b is a cross sectional view of FET 200 along plane 5b—5b of FIG. 4. FET 200 also includes source region 201, drain region 202, gate oxide 206, field oxide 207 and substrate 210.

Substrate 210 is a semiconductor material, such as silicon, having a monocrystalline structure. Substrate 210 is shown in FIGS. 5a and 5b as p-type material. Gate oxide 206 and field oxide 207 are formed over the upper surface of substrate 210 using conventional methods. Field oxide 207 defines an active region 220 of FET 200. Source region 201 and drain region 202 are n-type regions located in substrate 210. Channel region 204 extends between source region 201 and drain region 202.

Polycide gate electrode 203 includes heavily doped n-type polysilicon layer 203a and metal silicide layer 203b. As shown in FIGS. 5a and 5b, polysilicon layer 203a extends a first height H1 above gate oxide layer 206. Field oxide 207 extends a second height H2 above gate oxide layer 206. First height H1 is greater than second height H2. This allows the substantially planar upper surface 213 of polysilicon layer 203a to extend over field oxide layer 207. Polysilicon layer 203a is conductively doped using in situ doping or ion implantation. Phosphorus oxychloride ($POCl_3$) can be used as a dopant source in accordance with conventional techniques. Silicide layer 203b is located over planar upper surface 213 of polysilicon layer 203a.

Figure 6A:
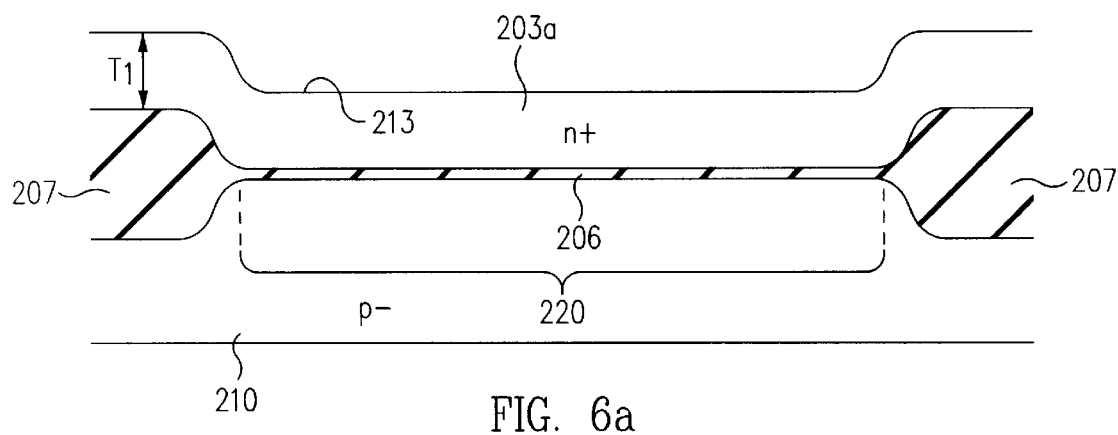
FIGS. 6a–6b are cross sectional views illustrating process steps used to fabricate the gate electrode of the FET of FIG. 4.
Figure 6B:
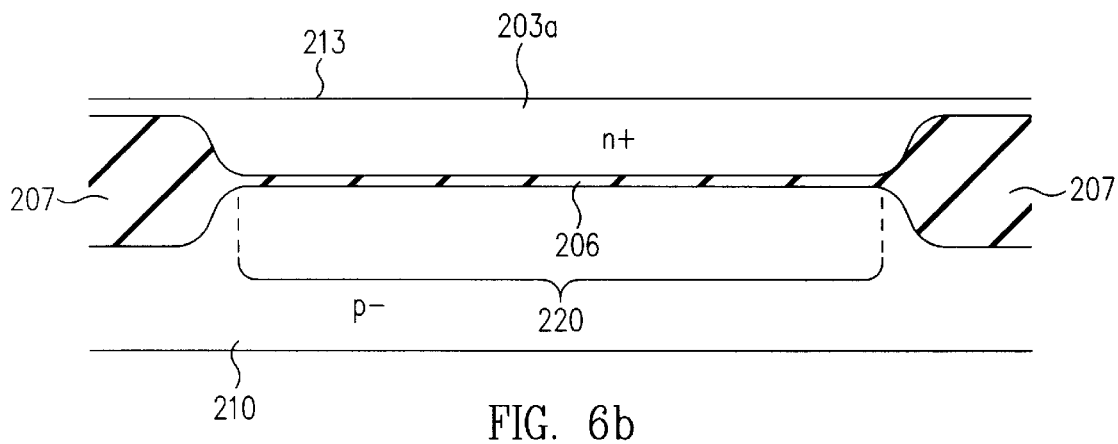

FIGS. 6a and 6b illustrate process steps used to fabricate polycide gate electrode 203 in accordance with one embodiment of the invention. FIGS. 6a and 6b are views along plane 5b—5b of FIG. 4. Gate oxide layer 206 and field oxide layer 207 are formed over substrate 210 using conventional methods. Gate oxide layer 206 typically has a thickness in the range of 60 to 500 angstroms and field oxide layer 207 typically has a thickness in the range of 1000 to 8000 angstroms.

After gate oxide layer 206 and field oxide layer 207 are formed, a layer 203a of non-monocrystalline silicon, such as polycrystalline silicon, is deposited over gate oxide 206 and field oxide 207 using a conventional method. Polycrystalline silicon layer 203a is heavily doped using conventional methods. As shown in FIG. 6a, polysilicon layer 203a is deposited to a thickness T1 which is greater than the height H2 of field oxide layer 207. Thickness T1 of polysilicon layer 203a is in the range of 3000 to 6000 angstroms.

The upper surface 213 of polysilicon layer 203a is then planarized, thereby providing a substantially planar upper surface 213 to polysilicon layer 203a (FIG. 6b).

Upper surface 213 can be planarized by chemical/mechanical polishing (CMP), masking and etching selected portions of upper surface 213, etchback planarization, or any other suitable planarization method. In a particular embodiment, a planarization layer consisting of photoresist or spin-on-glass (SOG) is formed over the upper surface 213 of polysilicon layer 203a. The resulting structure is spun such that the upper surface of the planarization layer is substantially flat. An etch back is then performed with an etchant which attacks the planarization layer at approximately the same rate as polysilicon layer 203a. This etch back removes the planarization layer and the upwardly protruding portions of polysilicon layer 203a. As a result, upper surface 213 becomes substantially planar.

After upper surface 213 of polysilicon layer 203a is planarized, silicide layer 203b is formed over upper surface 213 using one of several techniques. One technique includes performing a metal silicide deposition. Metal or metal silicide can be deposited by sputtering, evaporation, CVD, or any other suitable method. Another technique for forming silicide layer 203b is to deposit a layer of metal, such as tungsten, titanium or cobalt, over polysilicon layer 203a, and then heat the resulting structure at 550° C. to 900° C. The heating step causes the metal to react with underlying polysilicon layer 203a. The relative thicknesses of the metal layer and polysilicon layer 203a are selected such that substantially all of the metal layer reacts with a portion of polysilicon layer 203a, thereby forming metal silicide layer 203b.

Figure 1:
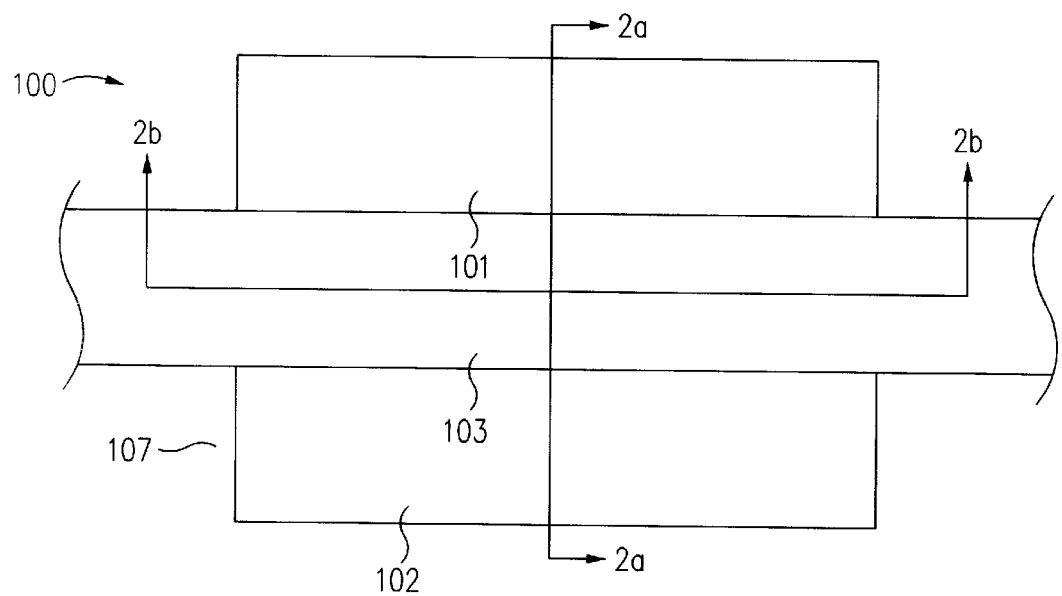
FIG. 1 is a top view of a conventional FET.
Figure 2A:
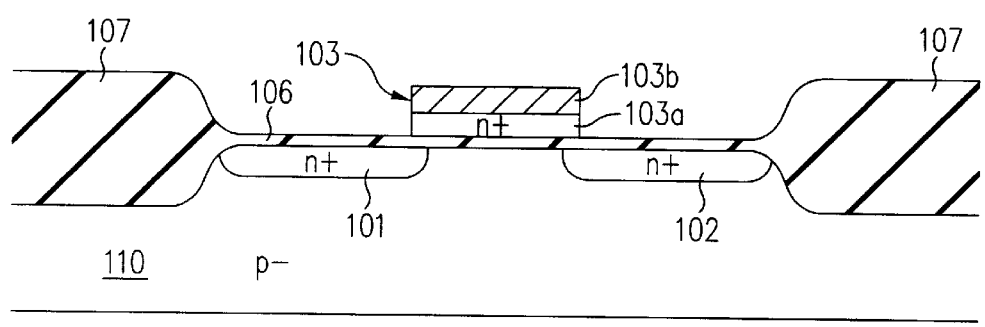
FIG. 2a is a cross sectional view of the FET of FIG. 1 along plane 2a—2a of FIG. 1.
Figure 2B:
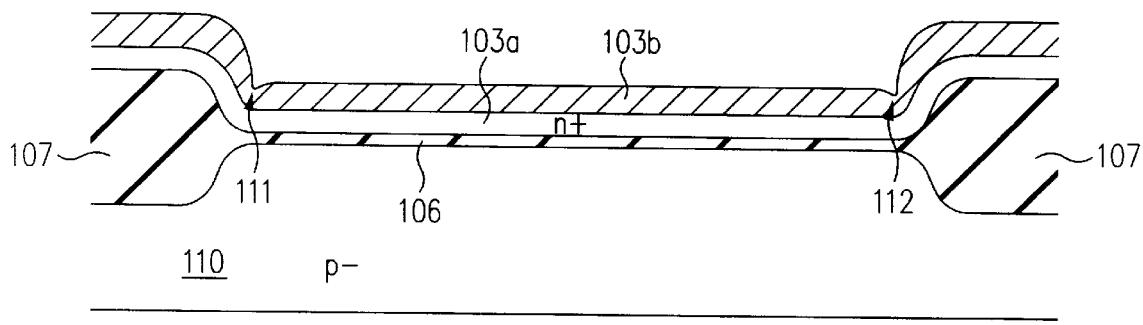
FIG. 2b is a cross sectional view of the FET of FIG. 1 along plane 2b—2b of FIG. 1.
Figure 3:
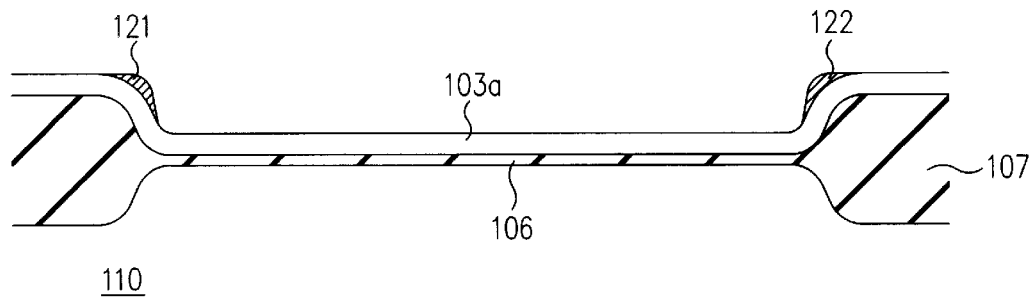
FIG. 3 is a cross sectional view of a conventional semiconductor structure which includes silicide stringers.

Silicide layer 203b can be tungsten silicide ($WSi_x$, where $x \geq 2$), titanium silicide ($TiSi_x$, where $x \geq 2$), cobalt silicide ($CoSi_x$, where $x \geq 2$), molybdenum silicide ($MoSi_x$, where $x \geq 2$) or any other suitable metal silicide. When silicide layer 203b is formed by depositing a metal silicide, silicide layer 203b is deposited to a thickness of 500 to 3000 angstroms. Because silicide layer 203b is deposited over the substantially planar upper surface 213 of polysilicon layer 203a, silicide layer 203 has a substantially uniform thickness along its entire length. The thin films formed at the step locations of prior art polycide gate electrodes (See, e.g., FIG. 2b) do not exist in gate electrode 203. As a result, silicide layer 203b has a relatively low, uniform resistance. When silicide layer 203b is formed by a depositing a layer of metal, such as tungsten, and then heating the remaining structure, similar benefits are achieved.

To complete the fabrication of gate electrode 203, a photoresist mask (not shown) is formed over silicide layer 203b using a conventional photolithographic technique. The mask protects the portion of silicide layer 203b which is used to form gate electrode 203. Because the mask is formed over the substantially planar upper surface 213 of silicide layer 203b, depth of focus problems which previously arose during the photolithography steps are minimized. As a result, smaller line sizes are possible.

A silicide etch is then performed to remove the unwanted portions of silicide layer 203b. Because silicide layer 203b is substantially planar, silicide stringers are not formed during this etch. Consequently, a silicide over-etch is typically not required to remove silicide stringers. A polysilicon etch (and an optional polysilicon over-etch) is to remove the unwanted portions of polysilicon layer 203a. The mask is then removed.

An ion implant step is performed using field oxide 207 and gate electrode 203 as an implant shield. In one embodiment, arsenic is implanted at an energy of 80 KeV and a dosage of $5E15$ ions/cm$^2$. An anneal is then performed to form source region 201 and drain region 202.

In addition to solving or mitigating the topography related problems of conventional polycide gate electrodes, planarized polycide gate 203 also mitigates the non-topography related problems of conventional polycide gate electrodes. Because polysilicon layer 203a is thicker than conventional polysilicon layers formed over active region 220, the stress exerted by silicide layer 203b on polysilicon layer 203a has less of an effect on polysilicon layer 203a when compared with the polysilicon layer of a conventional polycide gate electrode. As a result, the likelihood of stress related damage to gate oxide 206 is reduced. Furthermore, any fluorine present in silicide layer 203b must migrate through polysilicon layer 203a to cause damage to gate oxide 206. Because polysilicon layer 203a has an increased thickness compared to the polysilicon layers of conventional polycide gate electrodes, this migration is less likely to occur.

Figure 7A:
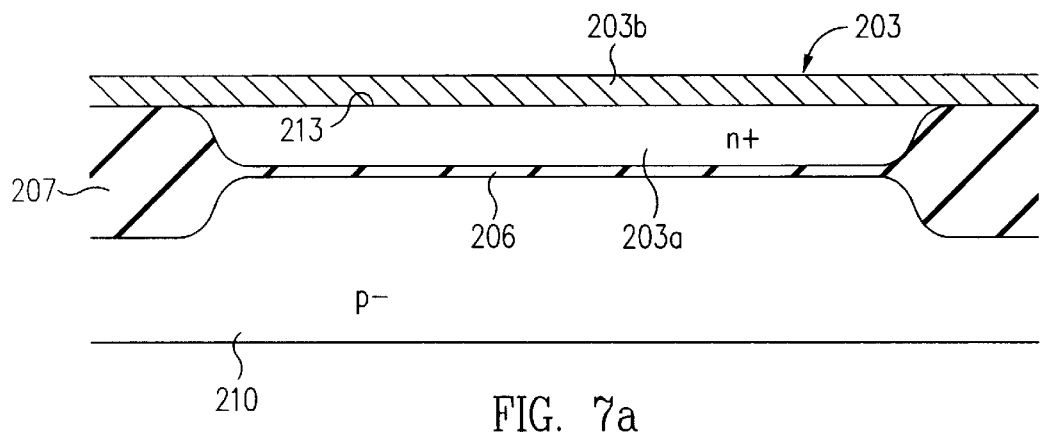
FIGS. 7a and 7b are cross sectional views of polycide structures in accordance with alternative embodiments of the invention.

Variations of the structure shown in FIG. 5b are possible. FIG. 7a, for example, illustrates a variation in which the upper surface 213 of polysilicon layer 203a is substantially co-planar with the upper surface of field oxide layer 207. Silicide layer 203b is formed over the co-planar upper surfaces of polysilicon layer 203a and field oxide layer 207. In one embodiment, the structure of FIG. 7a is created by planarizing polysilicon layer 203a, such that upper surface 213 of polysilicon layer 203a is substantially co-planar with the upper surface of field oxide layer 207. Silicide layer 203b is then deposited over the resulting structure.

In an alternative embodiment, the structure of FIG. 7a is created by planarizing doped polysilicon layer 203a, such that a thin layer of polysilicon extends over field oxide layer 207 (see, e.g., FIG. 6b). A layer of metal is then deposited over the flat upper surface of polysilicon layer 203a and the resulting structure is heated. The thicknesses of polysilicon layer 203a and the deposited metal layer are selected such that the thin layer of polysilicon extending over field oxide layer 207 is consumed during the creation of silicide layer 203b.

Figure 7B:
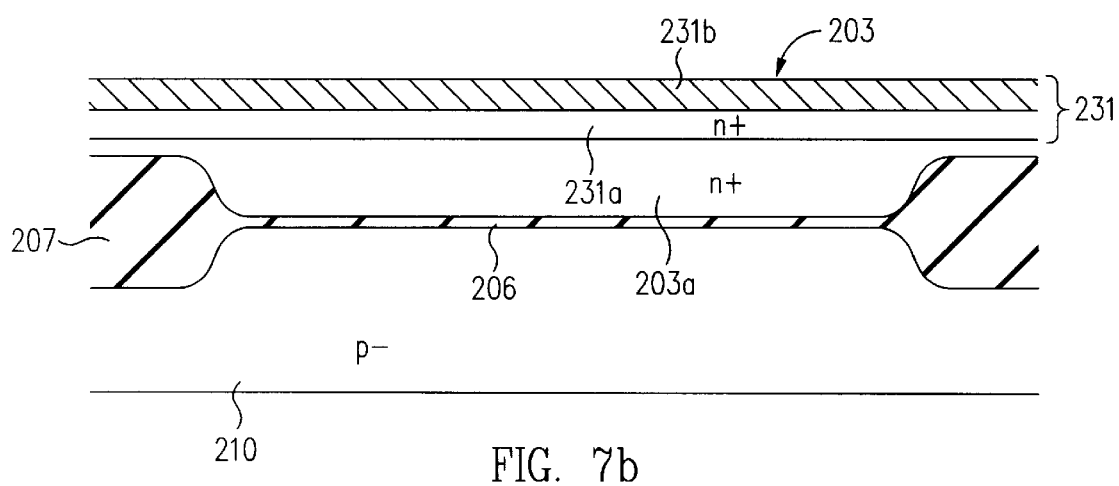

FIG. 7b illustrates yet another variation of the present invention. In this variation, a polycide layer 231 is formed over the substantially flat upper surface 213 of polysilicon layer 203a. Both polycide layer 231 and polysilicon layer 203a form polycide gate electrode 203. Polycide layer 231 is formed by depositing a layer of polysilicon 231a over the flat upper surface 213 of polysilicon layer 203a, and then doping polysilicon layer 231a with a heavy dose of phosphorous to achieve n-type conductivity. A silicide layer 231b is then deposited over the upper surface of doped polysilicon layer 231a. Alternatively, silicide layer 231b is formed by depositing a metal layer (not shown) over the upper surface of polysilicon layer 231a and heating the resulting structure.

Figure 8:
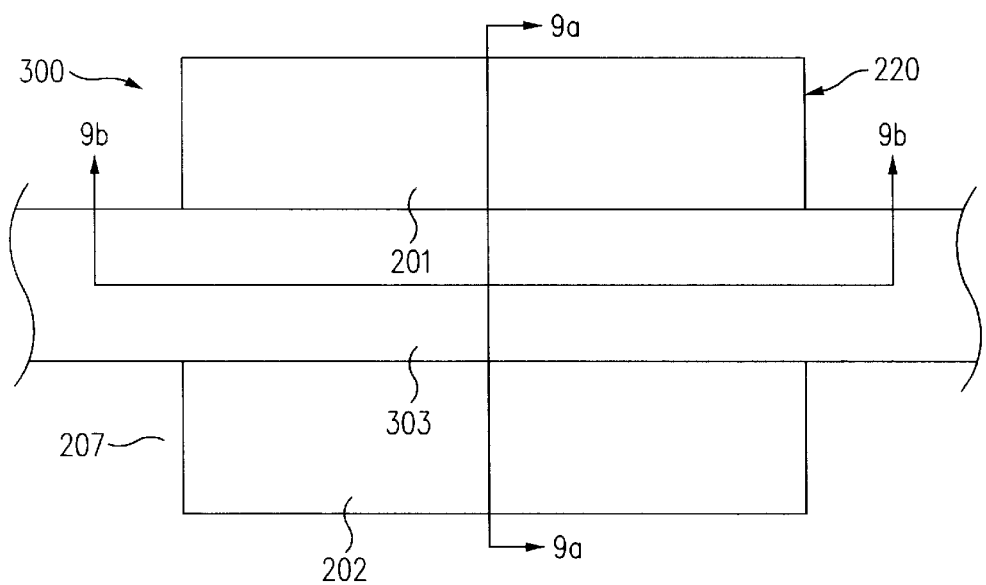
FIG. 8 is a top view of an FET having a planarized polycide gate electrode in accordance with another embodiment of the invention.
Figure 9A:
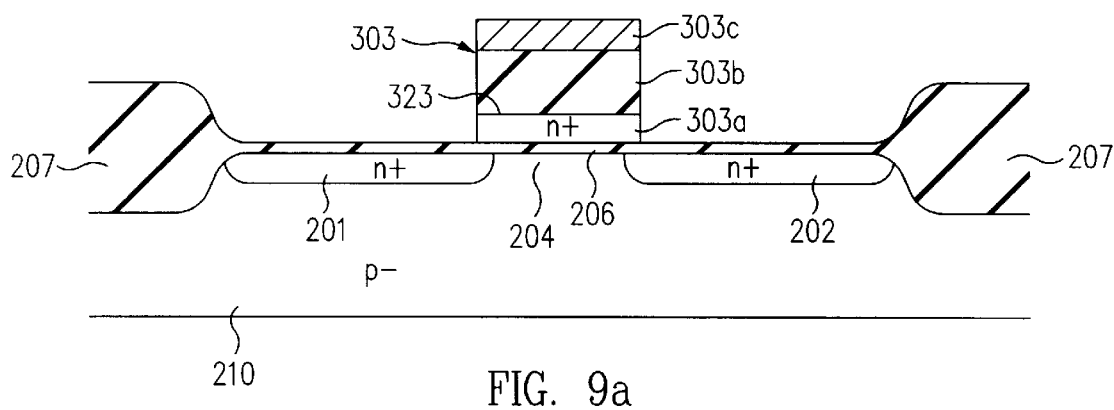
FIG. 9a is a cross sectional view of the FET of FIG. 8 along plane 9a—9a of FIG. 8.
Figure 9B:
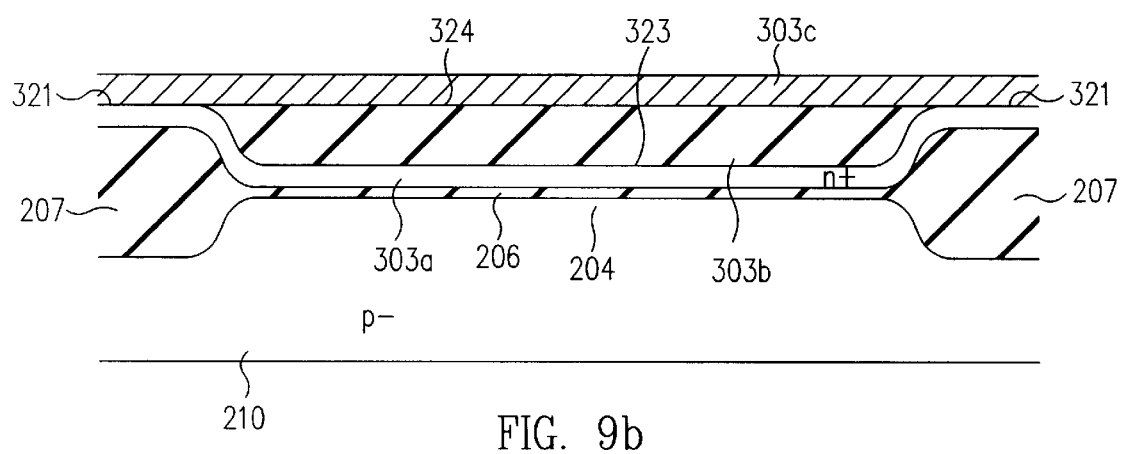
FIG. 9b is a cross sectional view of the FET of FIG. 8 along plane 9b—9b of FIG. 8.

FIG. 8 is a top view of n-channel FET 300 which has a planarized polycide gate electrode 303 in accordance with another embodiment of the invention. FIG. 9a is a cross sectional view of FET 300 along plane 9a—9a of FIG. 8. FIG. 9b is a cross sectional view of FET 300 along plane 9b—9b of FIG. 8. Certain elements of FET 300 are substantially identical to elements of FET 200. These identical elements are labeled with identical numbers. Thus, FET 300 includes source region 201, drain region 202, channel region 204, gate oxide 206, field oxide 207 and substrate 210.

As illustrated in FIGS. 9a and 9b, polycide gate electrode 303 includes heavily doped n-type polysilicon layer 303a, dielectric layer 303b and metal silicide layer 303c. Polysilicon layer 303a is located over gate oxide 206 and field oxide 207. Polysilicon layer 303a has a thickness of 2000 to 5000 angstroms. Polysilicon layer 303a has substantially co-planar upper surface portion 321 located over field oxide layer 207. Polysilicon layer 303a also has upper surface portion 323 which is located over gate oxide layer 206. Upper surface portion 323 is lower than upper surface portion 321.

Dielectric layer 303b, typically silicon oxide, is located over upper surface 323 of polysilicon layer 303a. Upper surface 324 of dielectric layer 303b is substantially co-planar with upper surface portion 321 of polysilicon layer 303a. Silicide layer 303c is located over the substantially co-planar surfaces 321 and 323 of polysilicon layer 303a and dielectric layer 303b.

Figure 10A:
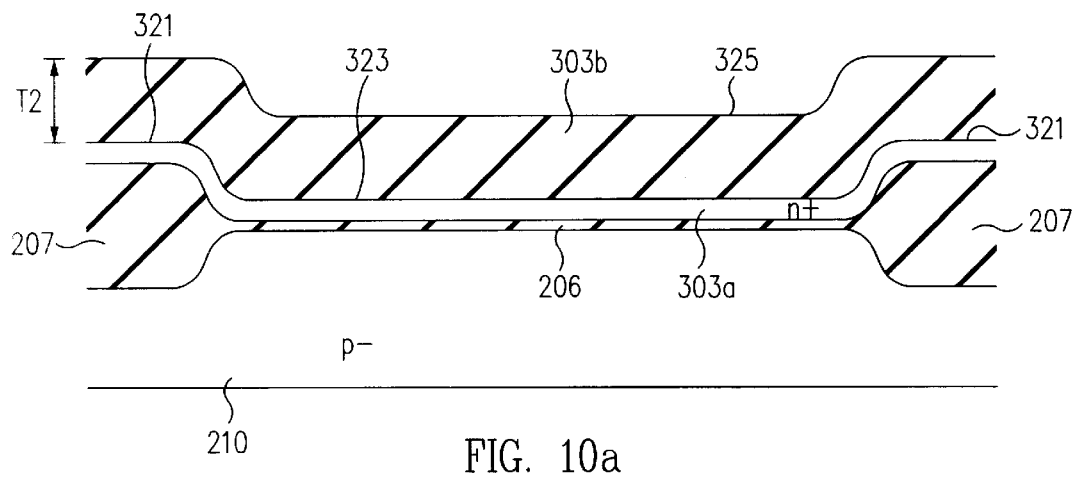
FIGS. 10a and 10b are cross sectional views illustrating process steps used to fabricate the gate electrode of the FET of FIG. 8.
Figure 10B:
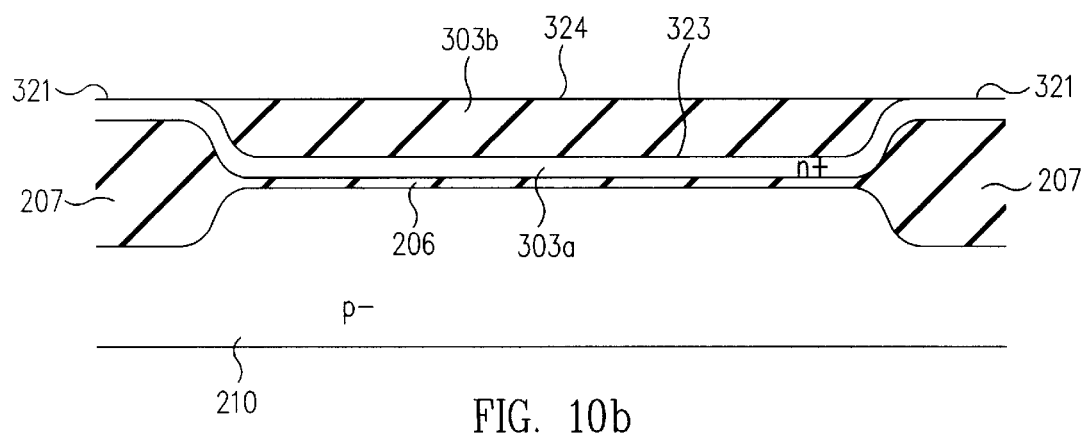

FIGS. 10a and 10b illustrate method steps used to create FET 300 in accordance with one embodiment of the invention. FIGS. 10a and 10b are views along plane 9b—9b of FIG. 8. Gate oxide layer 206 and field oxide layer 207 are formed over substrate 210 in the manner previously described. A uniform layer of polysilicon 303a is deposited over gate oxide layer 206 and field oxide layer 207 (FIG. 10a), and doped with a heavy dose of phosphorous to achieve n-type conductivity. Polysilicon layer 303a typically has a thickness of 2000 to 5000 angstroms.

Dielectric layer 303b is deposited over the upper surface of polysilicon layer 303a using conventional techniques (FIG. 10a). The thickness T2 of dielectric layer 303b is selected such that the upper surface 325 of the lowest part of dielectric layer 303b is at least as high as upper surface portion 321 of polysilicon layer 303a.

Dielectric layer 303b is then planarized in accordance with any one of the methods previously described. After this planarization step is complete (FIG. 10b), upper surface portion 321 of polysilicon layer 303a and upper surface portion 324 of dielectric layer 303b are substantially co-planar. Dielectric layer 303b thereby effectively fills in the valley formed by polysilicon layer 303a.

Silicide layer 303c is then formed over co-planar upper surface portion 321 of polysilicon layer 303a and upper surface portion 324 of dielectric layer 303b (FIG. 9b). Silicide layer 303c can be formed by depositing a layer of metal silicide or by depositing a metal layer and then heating the resulting structure. Masking and etching steps, similar to those previously described in connection with FET 200, are used to form gate electrode 303 from layers 303a–303c.

FET 300 exhibits the same advantageous features as FET 200. Additionally, dielectric layer 303b acts as a buffer to further reduce the stress exerted by silicide layer 303c on polysilicon layer 303a. Furthermore, dielectric layer 303b makes it more difficult for any fluorine present in silicide layer 303c to migrate through polysilicon layer 303a to gate oxide 206.

Figure 11:
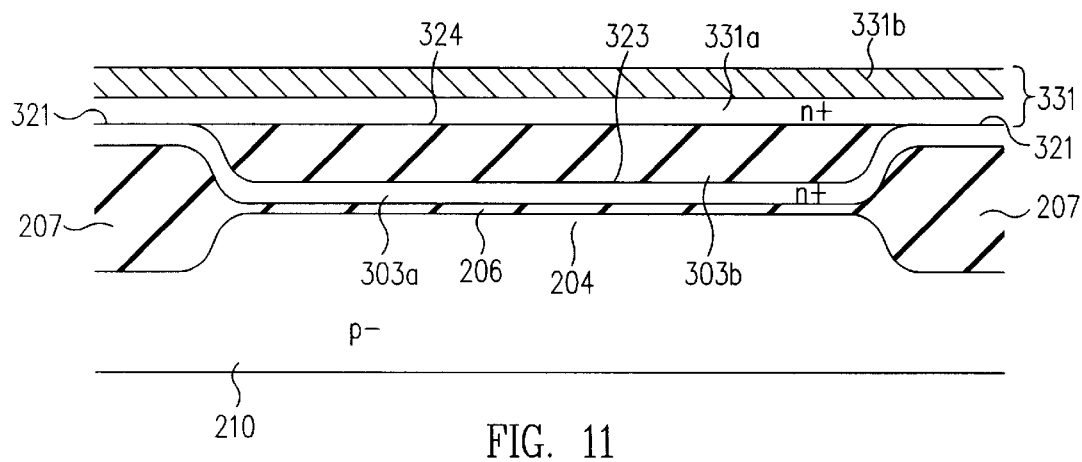
FIG. 11 is a cross sectional view of a polycide structure in accordance with another embodiment of the invention.

FIG. 11 illustrates a variation of gate electrode 303. In FIG. 11, silicide layer 303c is replaced with a polycide layer 331. Polycide layer 331 includes heavily doped n-type polysilicon layer 331a and silicide layer 331b. Polysilicon layer 331a is formed over the substantially co-planar surface 321 of polysilicon layer 303a and surface 324 of dielectric layer 303b. Silicide layer 331b is formed either by depositing a layer of metal silicide or by depositing a layer of polysilicon, depositing a layer of metal and heating the resulting structure.

While the present invention has been described in connection with particular embodiments, the invention is not limited to the embodiments disclosed, but is capable of various modifications which would be apparent to one skilled in the art. For example, the conductivity types disclosed can be reversed with a similar result. Furthermore, the non-monocrystalline silicon layers need not be deposited as polycrystalline silicon. In alternative embodiments, these non-monocrystalline silicon layers can be deposited as amorphous silicon and later transformed into polysilicon during subsequent heating steps. Moreover, the planarized polycide structure disclosed herein is not limited to gate electrodes for FETs, but can be applied to a wide variety of semiconductor structures such as bit lines, word lines and interconnects. Thus, the present invention is limited only by the following claims.

What is claimed is:

1. A method for forming polycide over a semiconductor structure having an irregular upper surface, the method comprising the steps of:

forming a first layer of non-monocrystalline silicon over the irregular upper surface of the semiconductor structure;

forming a dielectric layer over the first layer of non-monocrystalline silicon;

planarizing the first layer of non-monocrystalline silicon and the dielectric lave so as to provide the first layer of non-monocrystalline silicon and the dielectric layer with a substantially planar upper surface;

forming a second layer of non-monocrystalline silicon over the planar upper surface of the first layer of non-monocrystalline silicon and the dielectric layer; and forming a layer of metal silicide over the second layer of non-monocrystalline silicon, wherein the dielectric layer separates portions of the first and second layers of non-monocrystalline silicon after the layer of metal silicide is formed.

2. The method of claim 1, wherein the step of planarizing comprises chemical mechanical polishing.

3. The method of claim 1, wherein the step of planarizing comprises the steps of:

forming a mask over a first portion of the upper surface of the dielectric layer; and etching a second portion of the upper surface of the dielectric layer not covered by the mask.

4. The method of claim 1, wherein the step of planarizing comprises the steps of:

providing a planarization layer over the dielectric layer such that the planarization layer has a substantially planar upper surface; and etching back the planarization layer and upwardly protruding parts of the dielectric layer.

5. The method of claim 4, wherein the etching step is performed with an etchant that attacks the planarization layer and the dielectric layer at rates not substantially different from one another.

6. The method of claim 4, wherein the planarization layer comprises spin-on-glass or photoresist.

7. The method of claim 6, wherein the providing step comprises the steps of:

depositing the planarization layer; and spinning the semiconductor structure.

8. The method of claim 1, further comprising the step of heating the first layer of non-monocrystalline silicon such that the first layer of non-monocrystalline silicon consists substantially of polycrystalline silicon.

9. A method of forming a polycide gate electrode for a field effect transistor (FET) which includes a semiconductor substrate and a field oxide layer laterally located along the semiconductor substrate surrounding an active region of the FET, the method comprising the steps of:

forming a first layer of non-monocrystalline silicon over the substrate and field oxide layer of the FET;

forming a layer of dielectric material over the layer of non-monocrystalline silicon;

planarizing the layer of dielectric material, such that the layer of dielectric material has a substantially planar upper surface that is substantially co-planar with a portion of the upper surface of the layer of non-monocrystalline silicon;

forming a second layer of non-monocrystalline silicon over the planar upper surface of the first layer of non-monocrystalline silicon and the dielectric layer; and forming a layer of metal silicide over the planar upper surface of the layer of dielectric material and the portion of the upper surface of the second layer of non-monocrystalline silicon, wherein the dielectric layer separates portions of the first and second layers of non-monocrystalline silicon after the layer of metal silicide is formed.

10. The method of claim 9, further comprising the step of heating the layer of non-monocrystalline silicon such that the layer of non-monocrystalline silicon consists substantially of polycrystalline silicon.

* * * * *